United States Patent [19]

Schofield et al.

[11] Patent Number: 4,513,262
[45] Date of Patent: Apr. 23, 1985

[54] ACOUSTIC SURFACE WAVE DEVICE

[75] Inventors: John Schofield, Coulsdon; Robert F. Milsom, Redhill, both of England

[73] Assignee: U.S. Philips Corporation, New York, N.Y.

[21] Appl. No.: 531,806

[22] Filed: Sep. 13, 1983

[30] Foreign Application Priority Data

Sep. 15, 1982 [GB] United Kingdom ............... 8226282

[51] Int. Cl.³ ..................... H03H 9/64; H03H 9/145; H03H 9/30
[52] U.S. Cl. ............................. 333/194; 310/313 A; 310/313 C; 333/151; 333/154
[58] Field of Search ............................. 333/150–155, 333/193–196; 310/313 A, 313 B, 313 C, 313 D, 313 R

[56] References Cited

U.S. PATENT DOCUMENTS 4,409,571  10/1983  Milsom et al. ................. 333/196

OTHER PUBLICATIONS de Klerk–"Ultrasonic Transducers: 3. Surface Wave Transducers", Ultrasonics, Jan. 1971; pp. 35–48.

Primary Examiner—Marvin L. Nussbaum
Attorney, Agent, or Firm—Robert T. Mayer; Bernard Franzblau

[57] ABSTRACT

An acoustic surface wave device using an interdigital electrode array 2, 3 to launch and receive surface waves overcomes problems of diffraction by making the arrays approximately $3\lambda_c$ wide between the outer boundaries of the bus bars. As a result, the arrays can each only propagate and transduce a single acoustic surface waveguide mode which is symmetrical about the axis of the array.

7 Claims, 4 Drawing Figures

ACOUSTIC SURFACE WAVE DEVICE

This invention relates to an acoustic surface wave device including a piezoelectric substrate for propagating acoustic surface waves at a surface thereof and an acoustic surface wave transducer formed on said surface to launch or to receive acoustic surface waves at said surface along a propagation direction parallel to the axis of the transducer, in which said transducer includes at least one interdigital array of two overlapping sets of electrodes and each set is connected to one of a pair of opposite bus bars. Such a device will be referred to herein as an acoustic surface wave device of the kind referred to.

Such an acoustic surface wave device can comprise a filter arrangement as illustrated for example in FIG. 3.7 of page 71 of Acoustic Surface Waves edited by A. A. Oliner published 1978 by Springer-Verlag, in which a uniform transducer is coupled directly to an apodized transducer.

An acoustic surface wave filter of this kind can be computed which, under ideal conditions, will satisfy a desired pass band response to within given approximations, by techniques employing Fourier synthesis and computer optimization. Thus computer programs have been devised which will specify the required distribution and intensities of idealized transducing elements (sources) along the transducer. In an apodized interdigital array, such elements are realized in practice by the overlap of adjacent electrodes one from each of two overlapping sets of interdigital electrodes, each set being connected to a corresponding one of two opposite bus bars. The strength of each element is a function mainly of the length at right angles to the acoustic surface wave propagation direction, of said overlap, although end effects and the effects of nearest neighbouring electrodes have also to be taken into account depending on the transducing magnitude of the element (sometimes referred to as the strength of the source) under consideration. The distribution of overlaps along an apodized transducer can conveniently be indicated in a diagrammatic representation by the overlap envelope, which comprises a pair of lines drawn to follow the respective ends of the overlap between adjacent electrodes along the interdigital array.

In order to reduce the size of an acoustic surface wave device operating at a given frequency an attempt has been made to reduce the size of the interdigital transducer array. In general the length of the array will be determined by design factors such as the bandwidth and rejection characteristics required. However, when the width of an interdigital array is reduced, various difficulties tend to arise. For example, adverse diffraction effects will increase, also insertion loss will tend to rise necessitating the use of a crystal orientation having a relatively high coupling factor.

Acoustic surface wave transducers are frequently arranged on an anisotropic piezoelectric crystal so as to direct acoustic surface waves as nearly as possible along a self-collimating direction, i.e. a direction for which the velocity is a minimum relative to that for directions inclined to either side, so that if a diffracted acoustic surface wave departs from the said direction it will tend to travel faster and at least some of the acoustic surface wave energy will be turned back into the desired direction. Such a self-collimating direction can sometimes be associated with a lower coupling factor.

When a direction is used in which the self-collimating effect is reduced or absent, for any reason, such as to provide a higher coupling factor, notably to reduce insertion loss when the array is made narrower, the effects of diffraction on that part of the acoustic surface wave which travels furthest through the array will tend to become unacceptable, notably in an apodized structure in which the shorter overlap elements tend to occur near the ends of the array, causing the response of the device to depart significantly from the designed response.

Thus, as the width of an interdigital array is reduced under these conditions, acoustic surface waves which depart slightly from the axial direction in either direction as a result of diffraction will tend to be reflected back by the propagation discontinuity formed by the outer boundaries of the pair of bus bars due to the change in surface loading, and to propagate along the transducer as a multi-mode guided wave each mode of which has a phase velocity and a group velocity respectively faster and slower than the axial propagation velocity of that part of the acoustic surface wave which is propagating with a planar wavefront set at right angles to the axial direction. The effect of multimoding causes the measured transducer characteristic to depart increasingly from the design characteristic as the width of the array is reduced to a few wavelengths, e.g. into the region $12\lambda_c$ to $7\lambda_c$.

It is an object of the invention to provide an improved acoustic surface wave device of compact construction which can ameliorate some or all of the aforesaid difficulties.

According to the invention there is provided an acoustic surface wave device including a piezoelectric substrate for propagating acoustic surface waves at a surface thereof and an acoustic surface wave transducer formed on said surface to launch or to receive acoustic surface waves at said surface along a propagation direction parallel to the axis of the transducer. The said transducer includes at least one interdigital array of two overlapping sets of electrodes and each set is connected to one of a pair of opposite bus bars. The invention is characterized in that the overall width of the or each interdigital array between the outer boundaries of the or a said pair of bus bars, measured in a direction at right angles to the acoustic surface wave propagation direction, is so determined in relation to the wavelength $\lambda_c$ at the center frequency $f_c$ of the acoustic surface wave pass-band of the transducer, and in relation to the electrode distribution, that the or each said interdigital array functions as an acoustic surface waveguide which will only propagate and transduce a single acoustic surface wave guided energy mode which is symmetrical about the central propagation axis of the array.

The invention is based on the realization that by reducing the width of the array still further, it is possible to construct an interdigital array between a pair of opposing bus bars, which not only operates principally in a waveguide mode but will in fact only support a single symmetrical propagation mode, so that a weighted array can be constructed in which the problem of diffraction from small transducing elements (sources) at the far end of the array can be overcome, and in which, if desired, a relatively small bandwidth can be provided by a long but narrow array, again with substantially less disturbance from diffraction effects.

In the case of certain orientations of the propagation surface on lithium niobate, such as the Y-cut Z-propagating, or 124°, 128° or 131° rotated Y-cut X-propagating configurations, the overall width of the or each interdigital array is preferably not greater than $3.5\lambda_c$, although the width may be increased to not greater than $5\lambda_c$ provided that the interdigital array is made sufficiently symmetrical about the central propagation axis to ensure that only a single energy mode which is symmetrical about that axis can be transduced thereby. It should be noted however that the optimum width for single symmetrical mode propagation will depend, inter alia, on the coupling factor, a higher coupling factor in general leading to a narrower width. The interdigital array can be apodized if desired.

The guiding effect of the interdigital array enables an anisotropic piezoelectric crystal to be used, if desired, with the crystal surface oriented so that the acoustic surface wave propagation direction does not lie along a self-collimating direction for said propagation.

Preferably the substrate is Y-rotated X propagating lithium niobate in which the Y-rotation of the cut lies in the range from about 124° to 128° so that the undesired effects of bulk waves can be optimally reduced.

Embodiments of the invention will now be described by way of example, with reference to the accompanying drawings, in which.

Figure 1:
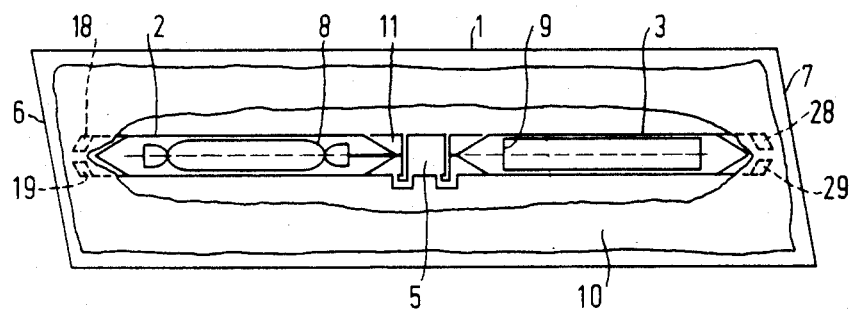
FIG. 1 shows an acoustic surface wave filter embodying the invention.

In FIG. 1 an acoustic surface wave device embodying the invention, in the form of a band-pass filter, comprises a piezoelectric substrate 1 for propagating an acoustic surface wave at a surface thereof, transducer means comprising an apodized input transducer 2 for launching acoustic wave energy into a propagation track 11 at said surface and a uniform output transducer 3 for converting acoustic wave energy propagating along the track 11 into an electrical signal. The input and output transducers are both of the interdigital type, the electrical input signal being applied between the two sets of electrodes of the transducer 2 and the electrical output signal being taken off from across the two sets of electrodes of the transducer 3. The overlap envelopes of the interdigital electrodes of the transducers 2 and 3 are shown respectively by the lines 8 and 9. Since the interdigital transducers 2, 3 are bidirectional, the unwanted surface wave energy launched in a direction away from the end which communicates with the other transducer 2, 3, is absorbed at least partially, by damping material 10 applied to the surface between the end of the transducer 2 and the edge 6 and, for corresponding reasons, between the end of the transducer 3 and the edge 7, and to other parts of the surface where undesired acoustic wave energy can propagate with the exception of the active regions of the interdigital arrays. To this point in the description the device corresponds to the device described and illustrated in FIG. 3.7 on page 71 of the aforesaid book, Acoustic Surface Waves edited by A. A. Oliner.

Figure 2:
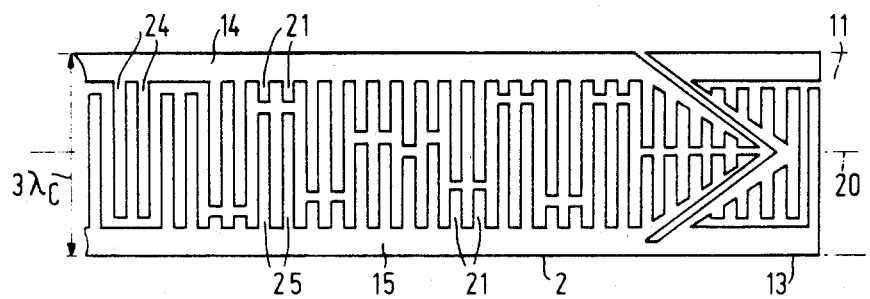
FIG. 2 shows a portion of an apodized transducer array in accordance with the invention.

In accordance with the invention the overall width of each of the interdigital transducer arrays 2 and 3 between the outer boundaries of the corresponding pair of bus bars, e.g. 14 and 15 in the transducer 2 shown in part in FIG. 2, measured in a direction at right angles to the acoustic surface wave propagation direction, must be so determined in relation to the wavelength $\lambda_c$ at the center frequency $f_c$ of the pass-band and in relation to the electrode distribution, that each of the transducer arrays 2, 3 functions as an acoustic surface waveguide which will only propagate and transduce a single energy mode which is symmetrical about the central propagation axis (20 in FIG. 2) of the array.

Figure 4:
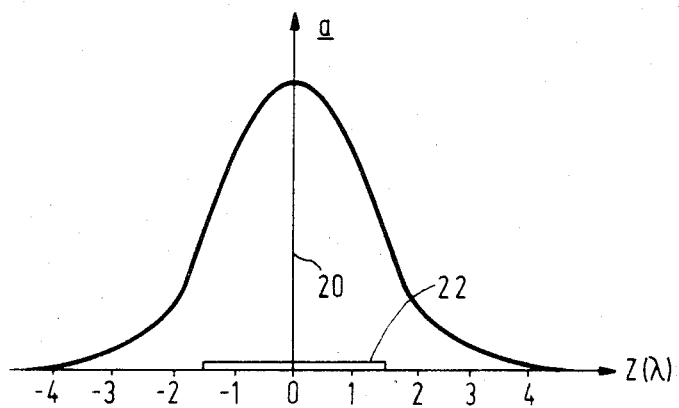
FIG. 4 is a graph illustrating the amplitude profile across a transducer axis.

FIG. 4 illustrates the amplitude profile produced across the symmetrical single guided mode acoustic surface wave beam propagating in the transducers 2 and 3 in accordance with the invention and shows the wave amplitude a plotted against the lateral distance Z from the axis 20 of the transducer measured in wavelengths ($\lambda$) for a $3\lambda$ transducer on 124° Y-rotated X-propagating lithium niobate. The amplitude varies cosinusoidally about the transducer axis 20 and within the metallized region 22, i.e. within the boundaries of the interdigital transducer pattern including the bus bars, and then tends to fall away exponentially beyond that region.

This profile is independent of any transducer element weighting produced by altering the amount of electrode overlap because in a transducer in accordance with the invention only this one (symmetrical) mode can propagate. Effective weighting can, however, be achieved by apodization because the position in the Z-direction with respect to the transducer axis 20, of the break in an electrode at which the polarity reverses, determines the strength of coupling to the guided mode. The weight of the ith transducing element (source) is to a first order proportional to $\sin(kZ_i)/k$ (where k is a crystal parameter), instead of being proportional to $Z_i$ as in the conventional wide aperture transducer, where $Z_i$ is the distance between the break in the electrode and the center line (axis 20) of the structure. Because the beam profile remains constant, apart from a very small overall variation with frequency which is dependent only on the width of the guide and not on the weighting, the frequency response of the filter is essentially the product of the response of the two transducers, and conventional synthesis can be used to determine the weights required to meet a given specification. The source strength correction hereinbefore mentioned can be readily applied to the final geometrical implementation of the transducer electrode pattern. The parameter k is mainly a function of the crystal orientation and guide width, and only varies very slowly with frequency and can probably be regarded as a constant.

The transducer array 2 of FIG. 1 is shown in part, enlarged, in FIG. 2, and comprises an apodized interdigital array of two sets of electrodes in which the electrodes of each set are connected to a corresponding one of the pair of opposite bus bars 14, 15, having respective terminal connections 18, 19 (FIG. 1). The bus bar 14 is connected to a source of signal and, in order to minimize capacitive breakthrough, the bus bar 15 is connected to signal ground. The respective sets of electrodes and corresponding bus bars can however, if desired, be driven in antiphase by a source of signal voltage, but in that case a further conductive material pattern connected to ground may be required adjacent the bus bars as a screen to reduce direct electrical breakthrough. A grounded screen 5 formed conventionally by metallization is interspersed between the two transducers 2 and 3, and to assist the guided wave it is also made a suitable width so as to support the single symmetrical guided mode.

The electrodes forming each of the two sets of the apodized interdigital array 2 suitably comprise double electrodes 24, 25, as described in a paper entitled "Applications of double electrodes in acoustic surface wave device design" by T. W. Bristol et al. presented to the Proc IEEE Ultrasonics Symposium, October 1972, in order to reduce adverse reflection effects from the electrodes. The spaces between the electrodes of a given set not occupied by overlapping portions of electrodes of the other set are filled by dummy electrodes 21, also double, connected to the same bus bars as the electrodes of the given set, as described in Applied Physics Letters, 1st December, 1971, Volume 19, Number 11, at pages 456 to 459.

The communicating end 13 of the transducer 2 is arranged as described in European Patent Application No. 83200550.8, so that the undesired transducing edge-element (edge source) at the outer boundary of the signal-driven end-electrode or bus bar will direct or receive acoustic surface waves along a direction away from the array propagation axis 20.

In forming an interdigital array using double electrodes as in FIG. 2, the periodicity of the double electrodes will be $\lambda/4$ and the width of each electrode will be $\lambda/8$. It must be understood, however, that the present array 2 is formed with an overall width such that acoustic surface waves propagate therealong in a single symmetrical guided mode. Such a mode is formed, in accordance with waveguide theory, by the superposition of synchronised intersecting acoustic surface wavefronts reflected at or near the outer boundaries. Thus the guided acoustic surface wave mode will propagate along the array with a phase velocity greater than the normal surface wave propagation velocity in a wide array, but the acoustic surface wave energy will only travel along the array at the group velocity of the mode which will be less than the free propagation velocity. Consequently the electrode size and spacing must correspond to the phase velocity, while the magnitudes of the transducing elements (sources) formed by pairs of overlapping double electrodes must be related in the impulse-time domain to the positions of those overlaps with respect to the group velocity of the guided mode.

Figure 3:
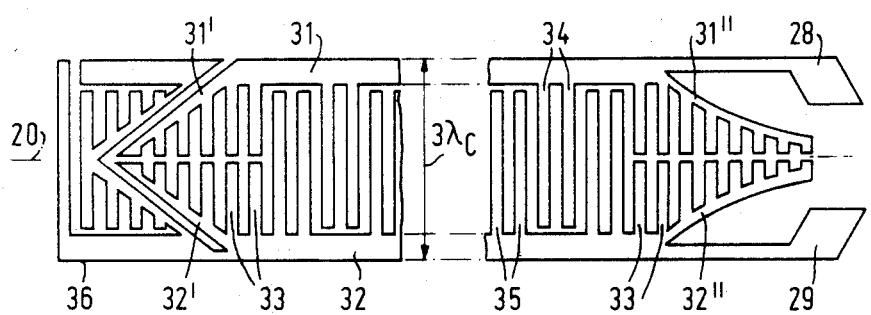
FIG. 3 shows a portion of a uniform transducer array in accordance with the invention.

The uniform transducer 3, shown enlarged and in part in FIG. 3, is also formed using double electrodes 34, 35, connected in a similar manner to that of transducer 2 shown in FIG. 2, between opposing bus bars 31, 32, and the ends of the array in the vicinity of the inwardly inclined portions 31', 31", 32', 32" of the bus bars 31, 32 is filled with dummy electrodes 22.

The communicating end 36 of the transducer 3 is formed in a manner similar to the end 13 of the transducer 2 in order to reduce the effects of undesired end transducing elements (end sources). The overall width of the array 3 between the outer boundaries of the opposing bus bars 31, 32 is, as in the case of the transducer 2, such that acoustic surface waves propagate therealong in a single symmetrical guided mode.

As shown in FIG. 1, the apodization of the launching array 2, indicated by the envelope 8, is in the form of a main lobe and minor half lobes at each end. This relates to a particular example of a device according to the invention, and other forms of apodization patterns can be used as desired. In fact other forms of weighting can be employed or no weighting at all, provided the array will propagate and transduce a single acoustic surface wave guided-energy mode which is symmetrical about the central propagation axis of the array.

It should be noted that the guided energy mode will in fact extend a short distance beyond the outer boundaries of the bus bars so care must be exercised in applying the damping medium 10 to the propagation surface of the device to ensure that a sufficient region is kept clear to either side of each transducer.

Since the end portions 13, 36, of both arrays are grounded, the screen 5 can be omitted and the two transducers brought adjacent to one another.

The interdigital electrodes of the embodiment can be formed on the piezoelectric substrate in conventional manner by a process of photolithography. The substrate can conveniently be Y-cut Z-propagating or 124° to 131° Y-rotated X-propagating lithium niobate on which the transducer arrays can each have a width between the outer edges of the bus bars lying in the range $3\lambda_c$ to $3.5\lambda_c$. In one example, the overall width was $3.2\lambda_c$ and the width of the electrode array between the bus bars was $1.8\lambda_c$. The overall width can be increased to not more than about $5\lambda_c$ if the array is made symmetrical about the propagation axis. If a substrate having a higher coupling coefficient is used, for example 41° Y-rotated X-propagating lithium niobate, the overall width of the array would have to be reduced correspondingly to ensure operation in the single symmetrical guided propagation mode.

One practical application of the device described is in the manufacture of a television receiver intermediate frequency filter and would preferably take the in-line form of FIG. 1, the device being formed on 124° to 131° Y-rotated X-propagating lithium niobate. Although the insertion loss of such a device would tend to be greater than that of a surface acoustic wave filter of conventional wide aperture, the impedance of the transducers would be greater so that a device in accordance with the invention can be connected directly into a circuit without the need for the series connected matching resistor frequently used with wide aperture devices. Consequently the overall insertion loss may have a similar value in the two cases.

We claim:

1. An acoustic surface wave device comprising a piezoelectric substrate for propagating acoustic surface waves at a surface thereof and an acoustic surface wave transducer formed on said surface to launch or to receive acoustic surface waves at said surface along a propagation direction parallel to the axis of the transducer, in which said transducer includes at least one interdigital array of two overlapping sets of electrodes with each set connected to one of a pair of opposite bus bars, characterized in that the overall width of an interdigital array between the outer boundaries of a said pair of bus bars measured in a direction at right angles to the acoustic surface wave propagation direction is so determined, in relation to the wavelength $\lambda_c$ at the center frequency $f_c$ of the acoustic surface wave pass-band of the transducer, and in relation to the electrode distribution, that a said interdigital array functions as an acoustic surface waveguide which will only propagate and transduce a single acoustic surface wave guided energy mode which is symmetrical about the central propagation axis of the array.

2. A device as claimed in claim 1, wherein the substrate comprises Y-cut Z-propagating or 124° to 131° rotated Y-cut X-propagating lithium niobate, characterized in that said overall width of an interdigital array lies in the range $3\lambda_c$ to $3.5\lambda_c$.

3. A device as claimed in claim 1, wherein the substrate comprises Y-cut Z-propagating or 124° to 131° rotated Y-cut X-propagating lithium niobate, characterized in that said interdigital array is symmetrical about the central propagation axis thereof, and said overall width of the array is not greater than $5\lambda_c$.

4. A device as claimed in claim 1, characterized in that the piezoelectric substrate comprises an anisotropic crystal oriented so that said propagation direction does not lie along a self-collimating direction for the propagation of acoustic surface waves.

5. A device as claimed in claim 1, characterized in that a said interdigital array comprises an apodized array.

6. A device as claimed in claim 2 wherein the piezoelectric substrate comprises an anisotropic crystal oriented so that said propagation direction does not lie along a self-collimating direction for the propagation of acoustic surface waves.

7. A device as claimed in claim 3 wherein the piezoelectric substrate comprises an anisotropic crystal oriented so that said propagation direction does not lie along a self-collimating direction for the propagation of acoustic surface waves.

* * * * *